US009570454B2

United States Patent
Liu et al.

(10) Patent No.: US 9,570,454 B2
(45) Date of Patent: Feb. 14, 2017

(54) STRUCTURE WITH EMEDDED EFS3 AND FINFET DEVICE

(71) Applicant: Taiwan Semiconductor Manufacturing Co., Ltd., Hsin-Chu (TW)

(72) Inventors: Ming Chyi Liu, Hsinchu (TW); Chang-Ming Wu, New Taipei (TW); Shih-Chang Liu, Alian Township (TW); Yu-Hsing Chang, Taipei (TW); Yuan-Tai Tseng, Zhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/749,970

(22) Filed: Jun. 25, 2015

(65) Prior Publication Data

US 2016/0379987 A1 Dec. 29, 2016

(51) Int. Cl.
*H01L 27/115* (2006.01)
*H01L 29/78* (2006.01)
*H01L 29/423* (2006.01)
*H01L 29/10* (2006.01)

(52) U.S. Cl.
CPC ..... *H01L 27/11524* (2013.01); *H01L 29/1037* (2013.01); *H01L 29/42328* (2013.01); *H01L 29/7851* (2013.01)

(58) Field of Classification Search
CPC ............ H01L 27/11524; H01L 29/1037; H01L 29/42328; H01L 29/7851
See application file for complete search history.

(56) References Cited

U.S. PATENT DOCUMENTS

| 9,117,749 B1* | 8/2015 | Or-Bach | H01L 27/2436 |
| 2009/0065845 A1* | 3/2009 | Kim | H01L 27/105 257/316 |
| 2011/0121406 A1* | 5/2011 | Lee | H01L 21/823431 257/401 |
| 2012/0273747 A1* | 11/2012 | Saitoh | H01L 21/823431 257/5 |
| 2014/0191330 A1* | 7/2014 | Cheng | H01L 21/823431 257/390 |
| 2015/0294976 A1* | 10/2015 | Kim | H01L 27/1104 438/702 |

\* cited by examiner

*Primary Examiner* — Fernando L Toledo
*Assistant Examiner* — Neil Prasad
(74) *Attorney, Agent, or Firm* — Eschweiler & Associates, LLC

(57) ABSTRACT

The present disclosure relates to an integrated chip having a FinFET device and an embedded flash memory device, and a method of formation. In some embodiments, the integrated chip has a logic region and a memory region that is laterally separated from the logic region. The logic region has a first plurality of fins of semiconductor material protruding outward from a semiconductor substrate. A gate electrode is arranged over the first plurality of fins of semiconductor material. The memory region has a second plurality of fins of semiconductor material extending outward from the semiconductor substrate. An embedded flash memory cell is arranged onto the second plurality of fins of semiconductor material. The resulting integrated chip structure provides for good performance since it contains both a FinFET device and an embedded flash memory device.

20 Claims, 13 Drawing Sheets

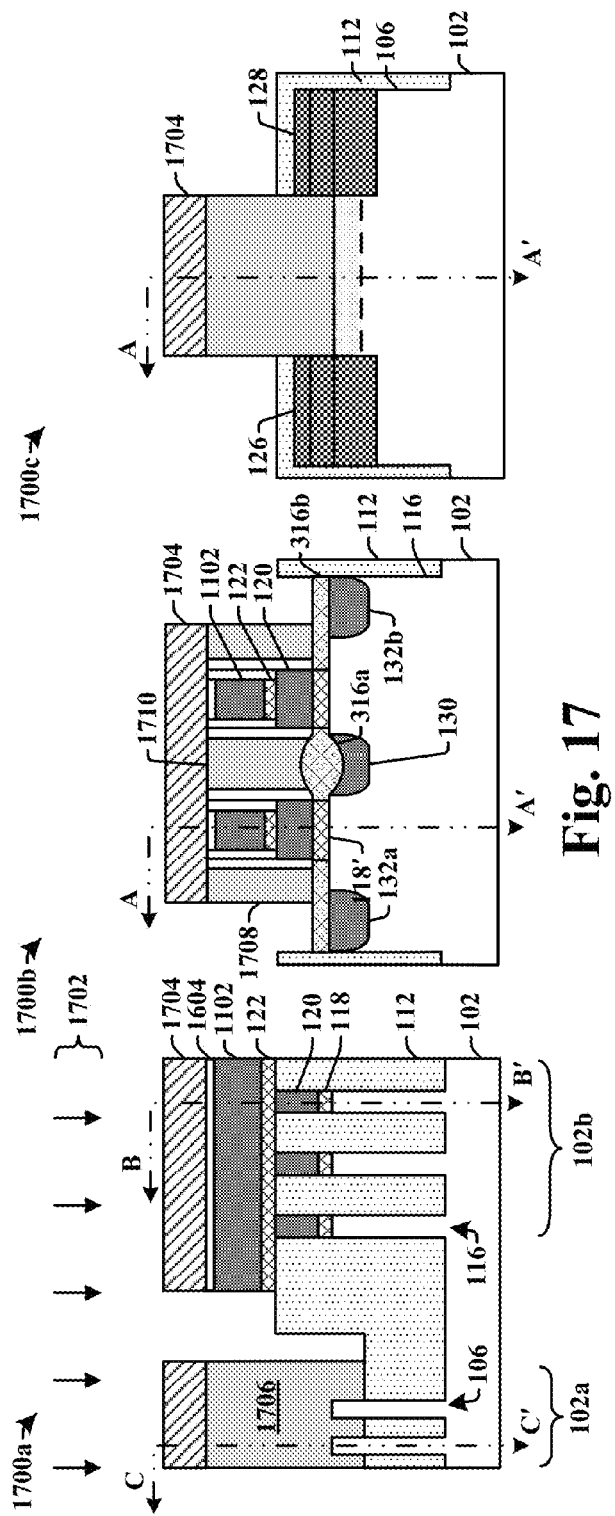
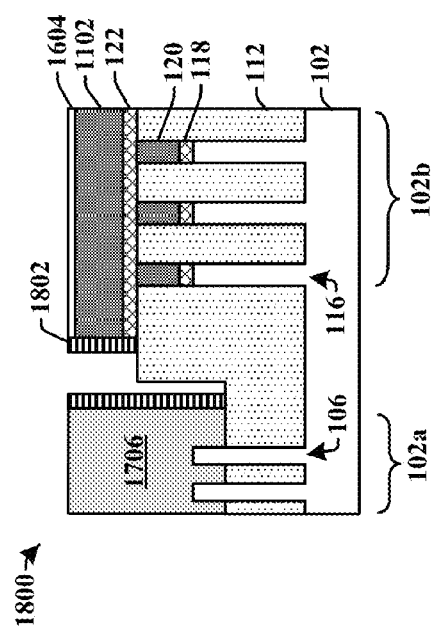
Fig. 17
Fig. 18

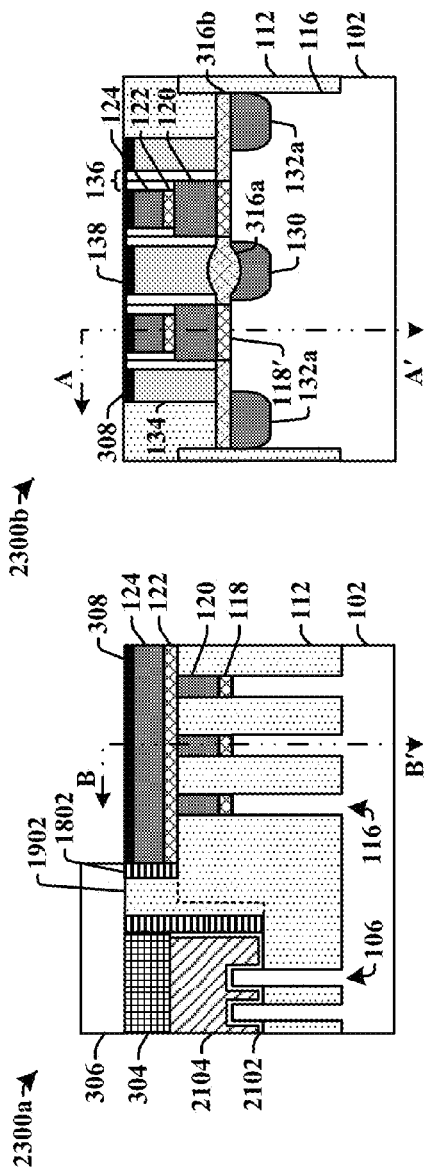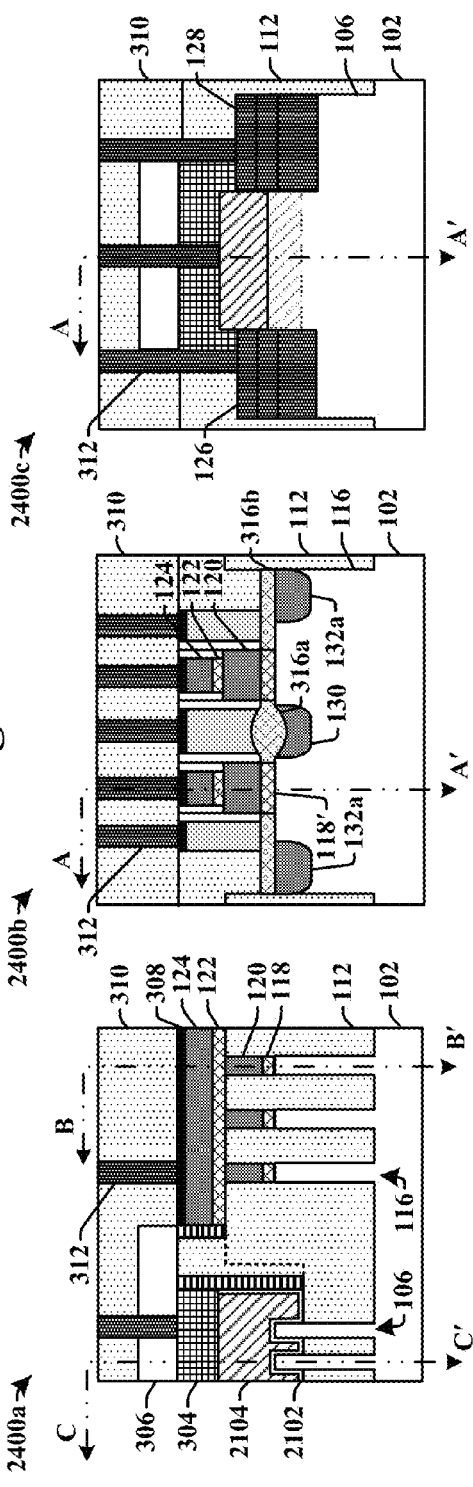
Fig. 23
Fig. 24

STRUCTURE WITH EMEDDED EFS3 AND FINFET DEVICE

BACKGROUND

Flash memory is an electronic non-volatile computer storage medium that can be electrically erased and reprogrammed. It is used in a wide variety of electronic devices and equipment (e.g., consumer electronics, automotive, etc.). Common types of flash memory cells include stacked gate memory cells and split-gate memory cells. Split-gate memory cells have several advantages over stacked gate memory cells, such as lower power consumption, higher injection efficiency, less susceptibility to short channel effects, and over erase immunity.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5-24 illustrate some embodiments of cross-sectional views showing a method of forming an integrated chip having a FinFET device and an embedded flash memory cell.

DETAILED DESCRIPTION

Figure 1A:
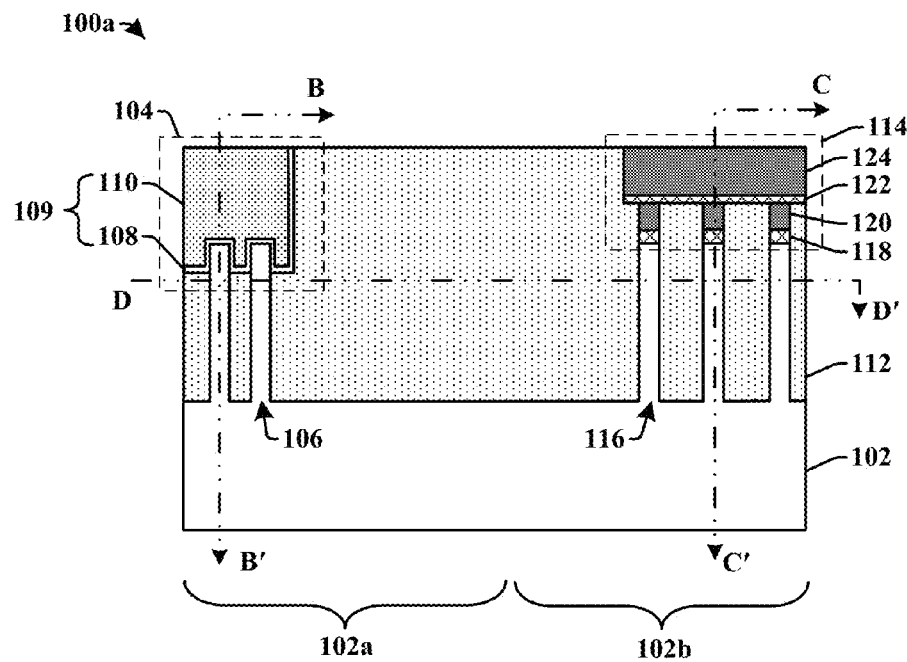
FIGS. 1A-1D illustrates some embodiments of an integrated chip having a FinFET device and an embedded flash memory cell.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In emerging technology nodes, limitations in processing capabilities and in fundamental material characteristics have made scaling of integrated chip components increasingly difficult. Therefore, modern day integrated chips comprise a number of features that provide for improved performance without using traditional notions of scaling. For example, embedded memory (i.e., electronic memory that is located on a same integrated chip die as logic functions) has become common in modern day integrated chips. By placing logic functions on a same integrated chip die as memory functions, interconnect distances can be reduced, thereby improving processing speed, parasitics, and other aspects of performance. FinFET (Field effect transistors) also provide improved performance compared to planar CMOS transistors. FinFET devices are three-dimensional structures that have a conducting channel comprising a fin of semiconducting material that rises above a planar substrate as a three-dimensional structure. A gate structure, configured to control the flow of charge carriers within the conducting channel, wraps around the fin of semiconducting material.

It has been appreciated that the integrated of embedded flash memory with a logic region comprising FinFET devices is beneficial to integrated chip performance. Accordingly, the present disclosure relates to an integrated chip having a FinFET device and an embedded flash memory device, and a method of formation. In some embodiments, the integrated chip comprises a logic region and a memory region that is laterally separated from the logic region. The logic region comprises a first plurality of fins of semiconductor material protruding outward from a semiconductor substrate. A gate electrode is arranged over the first plurality of fins of semiconductor material. The memory region comprises a second plurality of fins of semiconductor material extending outward from the semiconductor substrate. An embedded flash memory cell is arranged onto the second plurality of fins of semiconductor material. The resulting integrated chip structure provides for good performance since it contains both a FinFET device and an embedded flash memory device. Furthermore, the method of forming the integrated chip allows for the concurrent formation of some parts of the logic region and memory region (e.g., the select gate and logic gate), while using masking layers to maintain independent formation of other layers that can negatively impact device formation.

FIGS. 1A-1D illustrates some embodiments of cross-sectional views 100a-100d of an integrated chip having a FinFET (fin field effect transistor) device and an embedded flash memory cell.

As shown in cross-sectional view 100a, the integrated chip comprises a semiconductor substrate 102. The semiconductor substrate 102 comprises a logic region 102a having one or more FinFET devices 104 and an embedded flash memory region 102b having one or more embedded flash memory cells 114. A dielectric material 112 is arranged over the semiconductor substrate 102 at a position laterally between the logic region 102a and the embedded flash memory region 102b.

The logic region 102a comprises a first plurality of fins of semiconductor material 106 protruding outward from the semiconductor substrate 102. The first plurality of fins of semiconductor material 106 are separated from one another by the dielectric material 112, which electrically isolates the first plurality of fins of semiconductor material 106. A gate structure 109 is disposed over the semiconductor substrate 102 at a position that straddles the first plurality of fins of semiconductor material 106. The gate structure 109 is configured to control the flow of charge carriers within the first plurality of fins of semiconductor material 106. In some embodiments, the gate structure 109 may comprise a gate electrode 110 and a gate dielectric layer 108, which separates the gate electrode 110 from the first plurality of fins of semiconductor material 106.

The embedded flash memory region 102b comprises a second plurality of fins of semiconductor material 116 extending outward from the semiconductor substrate 102. The second plurality of fins of semiconductor material 116 are laterally separated from one another by the dielectric material 112, which electrically isolates the second plurality of fins of semiconductor material 116. A gate dielectric 118 is disposed onto upper surfaces of the second plurality of fins of semiconductor material 116. Floating gates 120 are arranged over the gate dielectric 118. The floating gates 120 are laterally separated from one another by the dielectric material 112. A control gate dielectric 122 is arranged onto the floating gates 120. The control gate dielectric 122 separates the floating gates 120 from an overlying control gate 124.

Figure 1B:
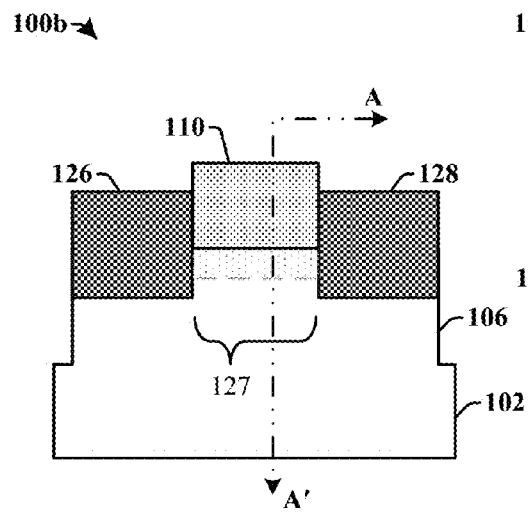

FIG. 1B illustrates a cross-sectional view 100b of the integrated chip shown in cross-sectional view 100a along cross-sectional line B-B' of the logic region 102a.

As shown in cross-sectional view 100b, one of the first plurality of fins of semiconductor material 106 extends between a source region 126 and a drain region 128. The gate electrode 110 is disposed over the fin of semiconductor material 106 and extends along sidewalls of the fin of semiconductor material. The gate electrode 110 may comprise a second fin that overlies the first plurality of fins of semiconductor material 106. In some embodiments, the source region 126 and the drain region may 128 comprise epitaxially grown structures disposed onto the fin of semiconductor material 106. During operation of the FinFET device, a bias voltage is selectively applied to the gate electrode 110. The electric potential from the bias voltage causes a channel region 127 to form within the first fin of semiconductor material 106 between the source region 126 and the drain region 128.

Figure 1C:
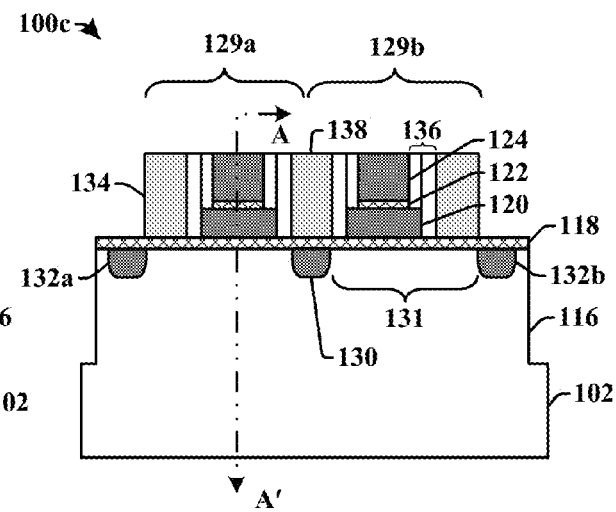

FIG. 1C illustrates a cross-sectional view 100c of the integrated chip shown in cross-sectional view 100a along cross-sectional line C-C' of the embedded flash memory region 102b.

As shown in cross-sectional view 100c, a common source region 130 is located between a first individual drain region 132a and a second individual drain region 132b. The common source region 130, the first individual drain region 132a, and the second individual drain region 132b are disposed along an upper surface one of the second plurality of fins of semiconductor material 116. Channel regions 131 extend between the common source region 130 and the individual drain regions 132. The gate dielectric 118 is disposed onto the upper surface of the fin of semiconductor material 116 over the channel regions 131.

A first data storage area 129a and a second data storage area 129b, respectively comprise a floating gate 120 disposed over the channel region 131. The floating gate 120 is configured to store charges associated with a first data state (e.g., a '1' or a '0'). The floating gate 120 is separated from an overlying control gate 124 by the control gate dielectric 122. A select gate 134 is disposed on a first side of the floating gate 120. An erase gate 138 overlying the common source region 130 is disposed on a second side of the floating gate 120 opposing the first side. One or more sidewall dielectric layers 136 extend along sidewalls of the erase gate 138 and separate the erase gate 138 from the floating gate 120 and from the overlying control gate 124.

During operation, biases can be applied to the select gate 134, the control gate 124, and/or the erase gate 138 to transfer charge carriers (e.g., holes or electrons) to/from the floating gate 120 through program, read, and erase operations. For example, during a program operation, a first bias voltage can be applied to the select gate 134, while a larger second bias voltage is applied to the control gate 124, thereby inducing formation of a conductive channel in the channel region 131. While the bias condition is applied, a positive voltage is concurrently applied to both the common source region 130 and erase gate 138 to induce electrons to flow from the individual drain regions 132 towards the common source region 130. The high bias voltage on the control gate 124 promotes Fowler-Nordheim tunneling of carriers from the channel region 131 towards the control gate 124. As the carriers tunnel towards the control gate 124, at least some carriers become trapped in the floating gate 120.

Figure 1D:
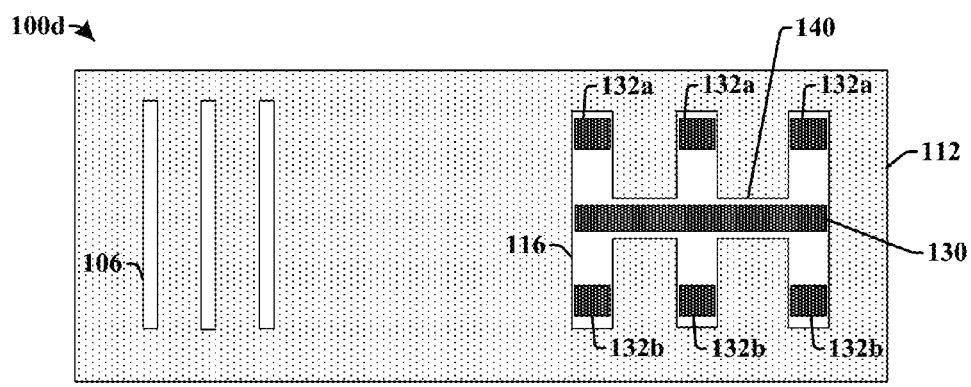

FIG. 1D illustrates a cross-sectional view 100d of the integrated chip shown in cross-sectional view 100a along cross-sectional line D-D' of the embedded flash memory region 102b.

As shown in cross-sectional view 100d, the first individual drain region 132a and a second individual drain region 132b are disposed within the second plurality of fins of semiconductor material 116. In some embodiments, the common source region 130 may be located within a fin of semiconductor material 140 protruding outward from the semiconductor substrate 102 and extending between the second plurality of fins of semiconductor material 116. In such embodiments, the common source region 130 extends along the fin to positions between first and second individual drain regions, 132a and 132b, within different ones of the second plurality of fins of semiconductor material 116.

Figure 2:
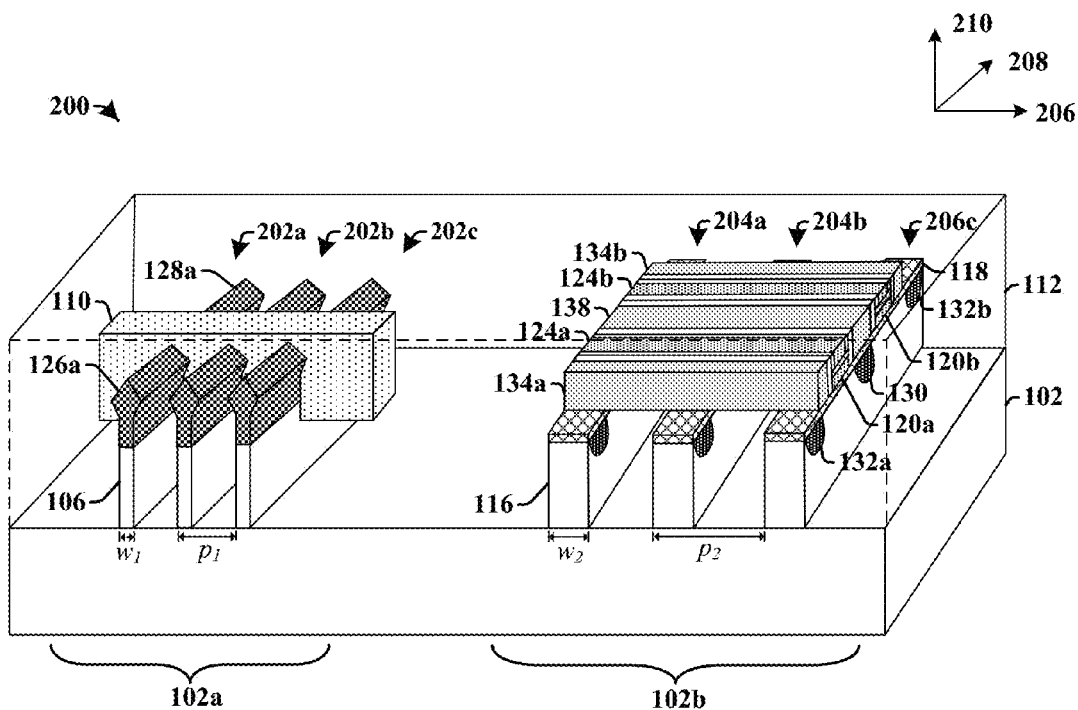
FIG. 2 illustrates a three-dimensional view of some embodiments of an integrated chip having a FinFET device and an embedded flash memory cell.

FIG. 2 illustrates a three-dimensional view 200 of some embodiments of an integrated chip having a logic region and an embedded flash memory region.

As shown in three-dimensional view 200, the integrated chip comprises a semiconductor substrate 102 having a logic region 102a laterally separated along a first direction 206 from an embedded flash memory region 102b by way of a dielectric material 112.

The logic region 102a comprises a plurality of FinFET devices 202a-202c. The plurality of FinFET devices 202a-202c respectively comprise a fin of semiconductor material 106 and an overlying gate electrode 110. The fin of semiconductor material 106 extends outward of the semiconductor substrate 102 (in a third direction 210) along a second direction 208. The gate electrode 110 is arranged over the fin of semiconductor material 106 and extends in the first direction 206, which is perpendicular to the second direction 208. The gate electrode 110 is separated from the fin of semiconductor material 106 by a gate dielectric layer (not shown).

The embedded flash memory region 102b comprises a plurality of split gate flash memory cells 204a-204c. Each of the plurality of split gate flash memory cells 204a-204c is arranged over one of a second plurality of fins of semiconductor material 116 that extend outward from the semiconductor substrate 102. The second plurality of fins of semiconductor material 116 comprise a common source region 130 separated from individual drain regions 132 in the second direction 208. The plurality of split gate flash memory cells 204a-204c comprise a floating gate 120a, a control gate 124a, and a select gate 134a. The floating gate 120a, the control gate 124a, and the select gate 134a extend in the second direction 208 over multiple fins of semiconductor material 116. In some embodiments, the select gate 134a may act as a word line for the embedded flash memory region 102b.

In some embodiments, the first plurality of fins of semiconductor material 106 and the second plurality of fins of semiconductor material 116 may have different widths. For example, the first plurality of fins of semiconductor material 106 may have a first width in the lateral direction of $w_1$, while the second plurality of fins of semiconductor material may have a second width in the lateral direction of $w_2$, which is greater than the first width $w_1$. In some additional embodiments, the first plurality of fins of semiconductor material 106 and the second plurality of fins of semiconductor material 116 may be arranged at different pitches. For example, the first plurality of fins of semiconductor material 106 may be arranged along a first pitch $p_1$, and the second plurality of fins of semiconductor material 116 may be arranged along a second pitch $p_2$ that is larger than the first pitch $p_1$.

Figure 3A:
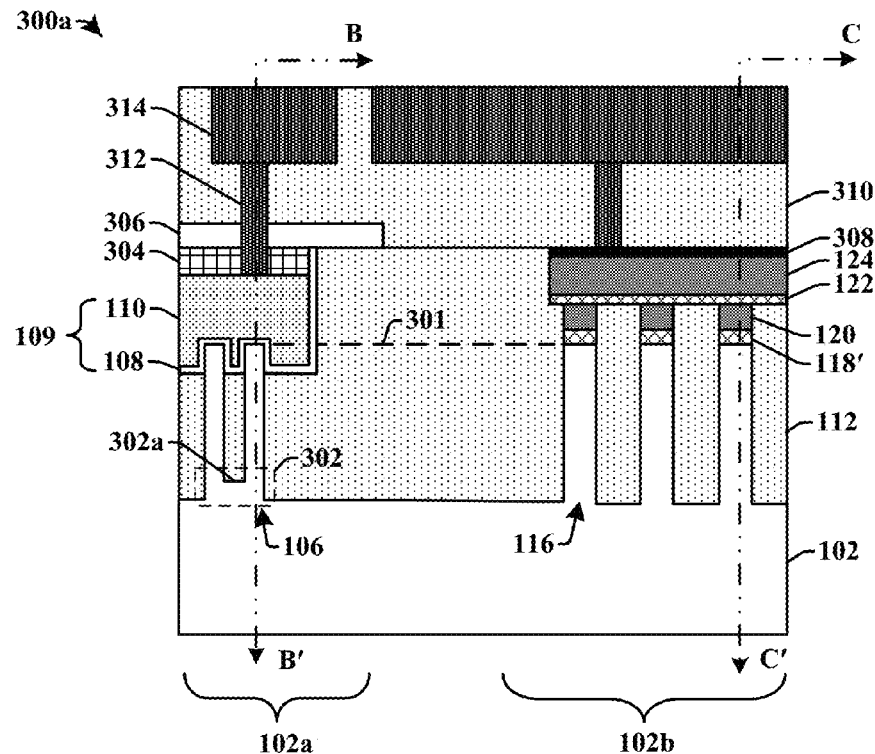
FIGS. 3A-3C illustrate some additional embodiments of an integrated chip having a FinFET device and an embedded flash memory cell.
Figures 3B, 3C:
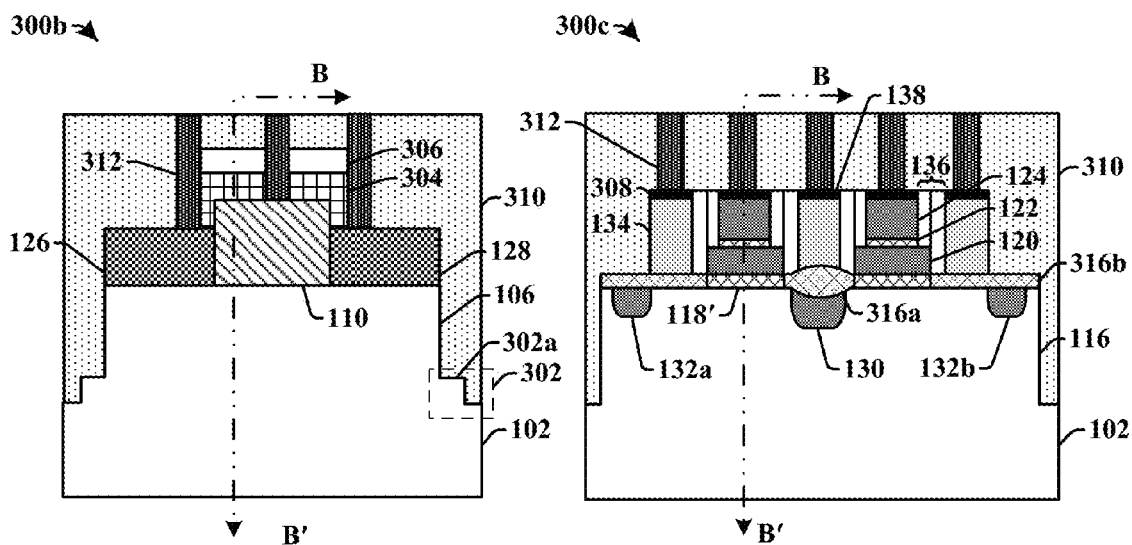

FIGS. 3A-3C illustrate some additional embodiments of cross-sectional views 300a-300c of an integrated chip having a FinFET device and an embedded flash memory cell.

As shown in cross-sectional view 300a, the integrated chip comprises a first plurality of fins of semiconductor material 106 and a second plurality of fins of semiconductor material 116 extending outward from a semiconductor substrate 102. The first plurality of fins of semiconductor material 106 and the second plurality of fins of semiconductor material 116 are separated by a dielectric material 112 comprising an oxide. In some embodiments, the semiconductor substrate 102 may comprise any type of semiconductor body (e.g., silicon, silicon-germanium, silicon-on-insulator) such as a semiconductor wafer and/or one or more die on a semiconductor wafer, as well as any other type of semiconductor and/or epitaxial layers associated therewith. In some embodiments, the first plurality of fins of semiconductor material 106 and the second plurality of fins of semiconductor material 116 may comprise silicon for example. In some embodiments, upper surfaces of first plurality of fins of semiconductor material 106 are vertically aligned with upper surfaces of second plurality of fins of semiconductor material 116 (along line 301).

In some embodiments, adjacent ones of the first plurality of fins of semiconductor material 106 in the logic region 102a may be connected by way of a remnant fin 302 extending between adjacent ones of the first plurality of fins of semiconductor material 106. The remnant fin 302 is a remnant of a tri-layer patterning process used to form the first plurality of fins of semiconductor material 106 and has an upper surface 302a that is below the gate dielectric 108, so that the remnant fin 302 does not vertically intersect the gate structure 109.

A gate dielectric layer 108 separates the first plurality of fins of semiconductor material 106 from an overlying gate electrode 110. In various embodiments, the gate dielectric layer 108 may comprise a silicon dioxide (e.g., $SiO_2$) layer or a high-k dielectric layer. In various embodiments, the gate electrode 110 may comprise a polysilicon layer or a metal gate layer (e.g., aluminum, aluminum oxide, etc.).

In some embodiments, a hard mask layer 304 may be arranged within the dielectric material 112 at a location that overlies the gate electrode 110. The hard mask layer 304 may have an upper surface vertically aligned with an upper surface of the dielectric material 112. In some embodiments, the hard mask layer 304 may comprise a silicon nitride (SiN) layer, for example. In some embodiments, a masking layer 306 is arranged over the hard mask layer 304. The masking layer 306 may have a lower surface that abuts the hard mask layer 304 and the dielectric material 112.

A floating gate dielectric 118' is arranged onto an upper surface of the second plurality of fins of semiconductor material 116. The floating gate dielectric 118' separates the second plurality of fins of semiconductor material 116 from an overlying floating gate 120. The floating gate dielectric 118' and the floating gates 120 are laterally separated by the dielectric material 112. In some embodiments, the floating gate dielectric 118' and the floating gates 120 have sidewalls that are substantially aligned with the second plurality of fins of semiconductor material 116. In some embodiments, the floating gate dielectric 118' may comprise an oxide layer (e.g., $SiO_2$, $GeO_2$, $Ga_2O_3$, etc.). In some embodiments, the floating gates 120 are vertically overlying and laterally offset from an upper surface of the first plurality of fins of semiconductor material 106.

The control gate dielectric 122 laterally extends over multiple floating gates 120. In some embodiments, the control gate dielectric 122 abuts an upper surface of multiple floating gates 120 and an upper surface of the dielectric material 112. A control gate 124 is disposed onto the control gate dielectric 122. In some embodiments, an upper surface of the control gate 124 vertically overlies an upper surface of the gate electrode 110. In some embodiments, a silicide layer 308 is disposed onto an upper surface of the control gate 124. The silicide layer 308 may comprise a nickel silicide, in some embodiments.

One or more inter-level dielectric (ILD) layers 310 are arranged over dielectric material 112. In various embodiments, the one or more ILD layers 310 may comprise silicon dioxide ($SiO_2$), a low-k dielectric material, or extreme low-k (ELK) dielectric material. A plurality of conductive contacts 312 and an overlying metal wire layer 314 are arranged within the ILD layer 310. In some embodiments, the plurality of conductive contacts 312 may comprise tungsten, for example.

FIG. 3B illustrates a cross-sectional view 300b of the integrated chip shown in cross-sectional view 300b along cross-sectional line B-B' of the logic region 102a.

As shown in cross-sectional view 300b, the first plurality of fins of semiconductor material 106 extend between a source region 126 and a drain region 128. In some embodiments, the source region 126 and the drain region 128 may comprise silicon or a silicon compound. For example, in various embodiments, the source region 126 and the drain region 128 may comprise an epitaxial layer comprising silicon phosphate (SiP), silicon germanium (SiGe), silicon carbide (SiC), etc. In some embodiments, sidewalls spacers (not shown) may be located on opposing sides of the gate electrode 110.

FIG. 3C illustrates a cross-sectional view 300c of the integrated chip shown in cross-sectional view 300c along cross-sectional line C-C' of the embedded flash memory region 102b.

As shown in cross-sectional view 300c, the floating gate dielectric layer 118' underlies the floating gates 120. The floating gate dielectric layer 118' is laterally surrounded by a common source dielectric layer 316a overlying the common source region 130 and a drain dielectric layer 316b overlying the individual drain regions 132. The common source dielectric layer 316a may have a greater thickness than under the floating gate dielectric layer 118' and/or over the drain dielectric layer 316b. In some embodiments, the common source dielectric layer 316a has rounded upper and lower surfaces over the common source region 130.

The silicide layer 308 is arranged onto upper surfaces of the control gate 124, the select gates 134, and the erase gate 138. Conductive contacts 312 arranged within the one or more ILD layers 310 and vertically extend to the silicide layer 308 on the control gate 124, the select gates 134, and the erase gate 138.

Figure 4:
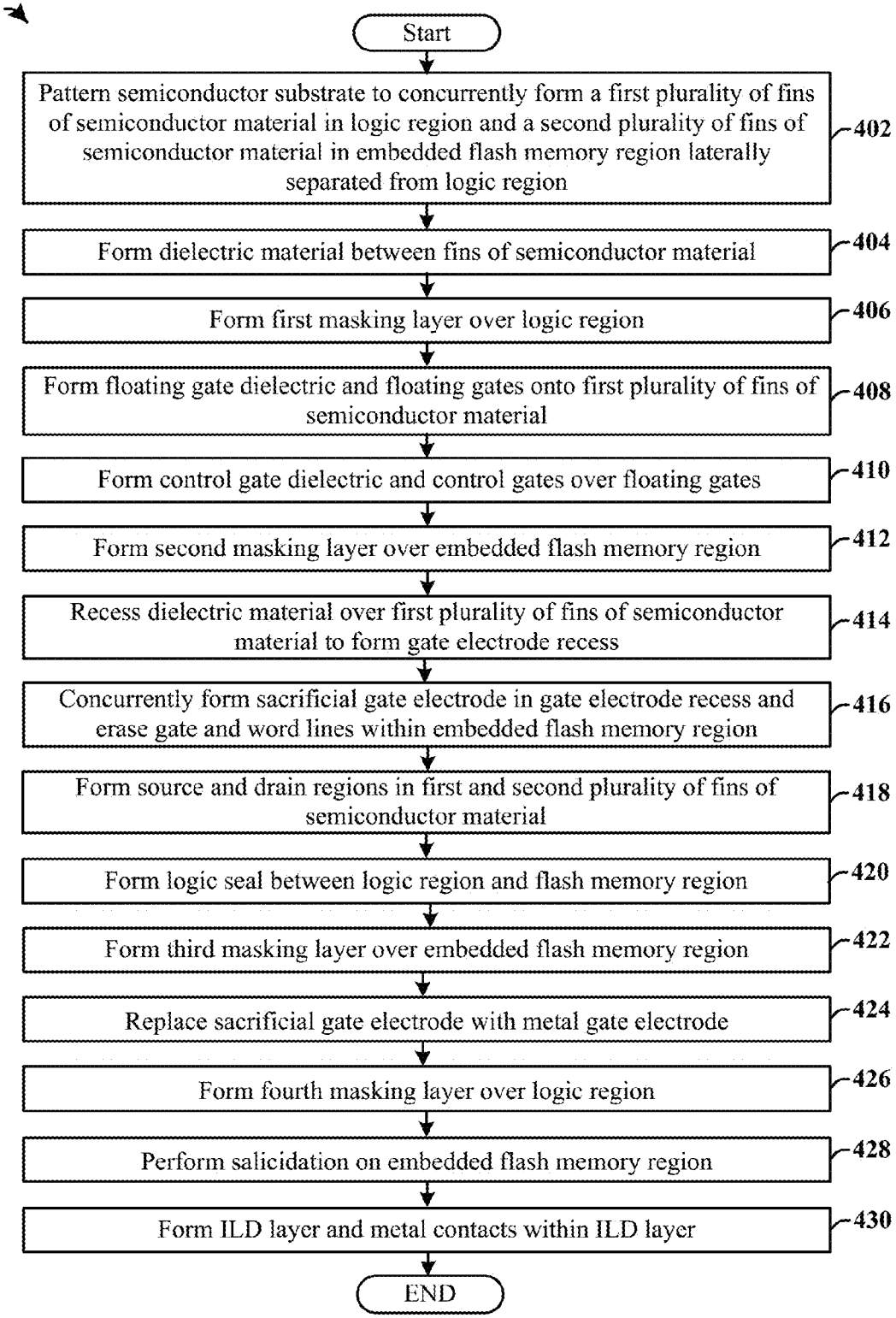
FIG. 4 illustrates a flow diagram of some embodiments of a method of forming an integrated chip having a FinFET device and an embedded flash memory cell.

FIG. 4 illustrates a flow diagram of some embodiments of a method 400 of forming an integrated chip having a FinFET device and an embedded flash memory cell.

While the disclosed method 400 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 402, a semiconductor substrate is patterned to concurrently form a first plurality of fins of semiconductor material in a logic region and a second plurality of fins of semiconductor material in an embedded flash memory region that is laterally separated from the logic region.

At 404, a dielectric material is formed between the first plurality of fins of semiconductor material and the second plurality of fins of semiconductor material.

At 406, a first masking layer is formed over the logic region.

At 408, a floating gate dielectric and overlying floating gates are formed onto the second plurality of fins of semiconductor material.

At 410, a control gate dielectric and control gates are formed over the floating gates.

At 412, a second masking layer is formed over the embedded flash memory region.

At 414, the dielectric material over the first plurality of fins of semiconductor material is recessed to form a gate electrode recess.

At 416, a sacrificial gate electrode is formed in the gate electrode recess concurrent to the formation of an erase gate and word lines within the embedded flash memory region.

At 418, source and drain regions are formed within the first plurality of fins (in logic region) and within the second plurality of fins (in embedded flash memory region).

At 420, a logic seal may be formed between the logic region and the embedded flash memory region, in some embodiments.

At 422, a third masking layer is formed over the embedded flash memory region.

At 424, the sacrificial gate electrode is replaced with a metal gate electrode.

At 426, a fourth masking layer is formed over the logic region

At 428, a salicidation process is performed on the embedded flash memory region.

At 430, an inter-level dielectric (ILD) layer is formed and metal contacts within ILD layer.

FIGS. 5-24 illustrate some embodiments of cross-sectional views showing a method of forming an integrated chip having a FinFET device and an embedded flash memory cell. Although FIGS. 5-24 are described in relation to method 400, it will be appreciated that the structures disclosed in FIGS. 5-24 are not limited to such a method, but instead may stand alone as structures independent of the method.

Figure 5:
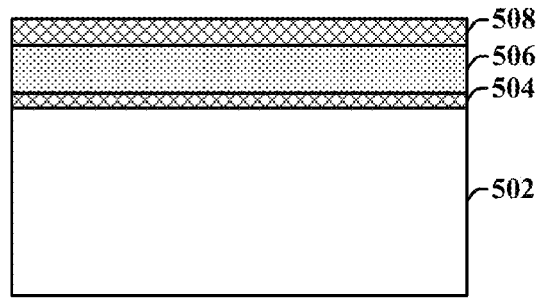
Figure 6:
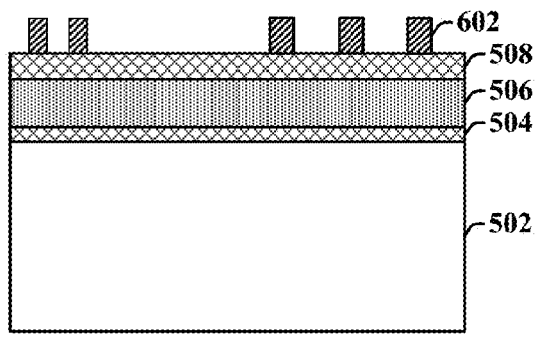
Figure 7:
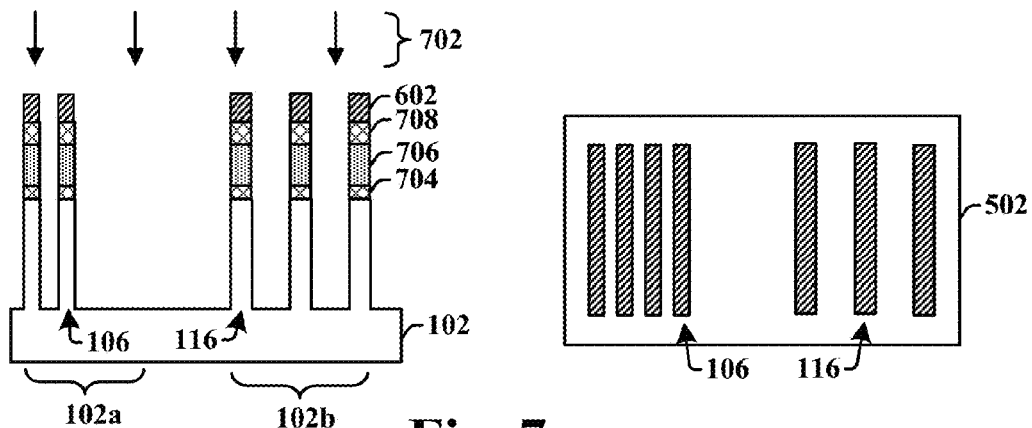

FIGS. 5-7 illustrate some embodiments of cross-sectional views, 500-800, of an integrated chip corresponding to act 402.

As shown in cross-sectional view 500 of FIG. 5, a plurality of sacrificial layers 504-508 are formed over a semiconductor substrate 502. In various embodiments, the semiconductor substrate 502 may comprise any type of semiconductor body (e.g., silicon/CMOS bulk, SiGe, SOI, etc.) such as a semiconductor wafer or one or more die on a wafer, as well as any other type of semiconductor and/or epitaxial layers formed thereon and/or otherwise associated therewith. In some embodiments, the plurality of sacrificial layers 504-508 may comprise a first sacrificial layer 504 comprising an oxide layer, a second sacrificial layer 506 formed onto the first sacrificial layer 504 and comprising a silicon nitride layer, and a third sacrificial layer 508 formed onto the second sacrificial layer 506 and comprising a second oxide layer. In some embodiments, the first sacrificial layer 504 may have a smaller thickness than the third sacrificial layer 508. The first sacrificial layer 504, the second sacrificial layer 506, and the third sacrificial layer 508 may be formed by way of a deposition technique (e.g., physical vapor deposition, chemical vapor deposition, plasma enhanced CVD, etc.).

As shown in cross-sectional view 600 of FIG. 6, a masking layer 602 is formed over the plurality of sacrificial layers 504-508. The masking layer 602 defines a location of the first and second plurality of fins of semiconductor material. In some embodiments, the masking layer 602 may comprise a photoresist layer. In some embodiments, the masking layer 602 may comprise a tri-layer photoresist layer. In such embodiments, the masking layer 602 may be formed as an oval shape, around sidewalls of a sacrificial patterning layer, which has connections between adjacent fins. An additional end-cut etching process may be performed to disconnect adjacent fins.

As shown in cross-sectional view 700a of FIG. 7, the semiconductor substrate 102 is selectively exposed to a first etchant 702 that is configured to selectively etch the semiconductor substrate 102 according to the masking layer 602 to form a first plurality of fins of semiconductor material 106 in the logic region 102a and a second plurality of fins of semiconductor material 116 in the embedded flash memory region 102b. The first etchant also patterns the first sacrificial layer to form a dielectric 704, the second sacrificial layer 706, and the third sacrificial layer 708. In some embodiments, the first etchant 702 may comprise a dry etchant have an etching chemistry comprising a fluorine species (e.g., $CF_4$, $CHF_3$, $C_4F_8$, etc.). In some embodiments, the etching chemistry may further comprise oxygen or hydrogen, for example. In other embodiments, the first etchant 702 may comprise a wet etchant comprising hydrofluoric acid (HF).

As shown in top-view 700b of FIG. 7, the first plurality of fins of semiconductor material 106 and the second plurality of fins of semiconductor material 116 comprise rectangular shaped structures that extend in parallel.

Figure 8:
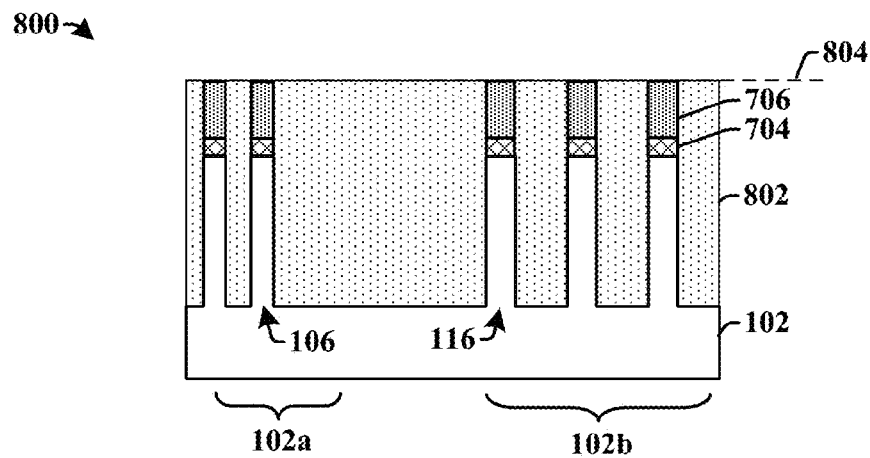

FIG. 8 illustrates some embodiments of a cross-sectional view 800 of an integrated chip corresponding to act 404.

As shown in cross-sectional view 800, a dielectric material 802 is formed between the first plurality of fins of semiconductor material 106 and the second plurality of fins of semiconductor material 116. After formation of the dielectric material 802 an anneal may be performed followed by a planarization process (along line 804) that removes excess material from the dielectric material 802 and that removes the third sacrificial layer 708. In some embodiments, the dielectric material 802 may be deposited by way of a spin coating process. In other embodiments, the dielectric material 802 may be deposited by way of a vapor deposition process (e.g., chemical vapor deposition (CVD), physical vapor deposition (PVD), plasma enhanced chemical vapor deposition (PECVD), etc.).

Figure 9:
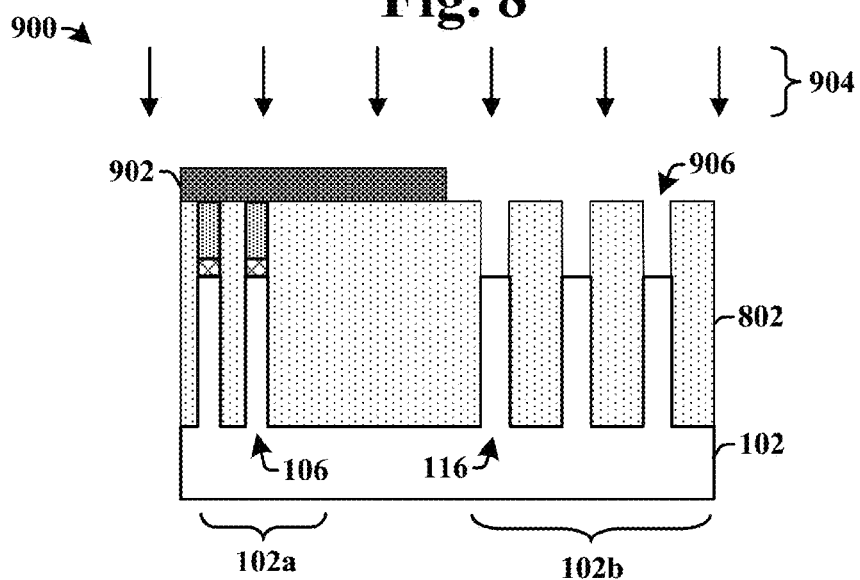
Figure 10:
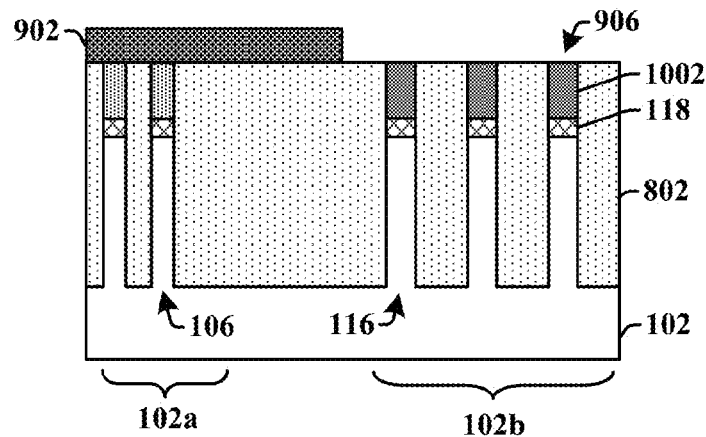

FIGS. 9-10 illustrate some embodiments of cross-sectional views, 900 and 1000, of an integrated chip corresponding to act 406-408.

As shown in cross-sectional view 900, a first masking layer 902 is formed over the logic region 102a. In some embodiments, the first masking layer 902 may comprise a photoresist layer or a hard mask layer, for example. After the first masking layer 902 has been formed, an unmasked region of the workpiece is exposed to a second etchant 904. The second etchant 904 has a high selectivity between the second sacrificial layer and the dielectric material 802, and therefore removes the dielectric layer and the second sacrificial layer (e.g., 704 and 706 in FIG. 8) leaving recesses 906 within the dielectric material 802. In various embodiments, the second etchant 904 may comprise a dry etchant (e.g., having an etching chemistry comprising a fluorine) or a wet etchant comprising phosphoric acid (H3PO4) followed by hydrofluoric acid (HF) to remove dielectric layer 704.

As shown in cross-sectional view 1000, a floating gate oxide 118 and floating gate layer 1002 are sequentially formed within the recesses 906 within the dielectric material 802. The floating gate layer 1002 is laterally separated by the dielectric material 802. In some embodiments, the floating gate layer 1002 may be formed by a deposition process.

Figure 11:
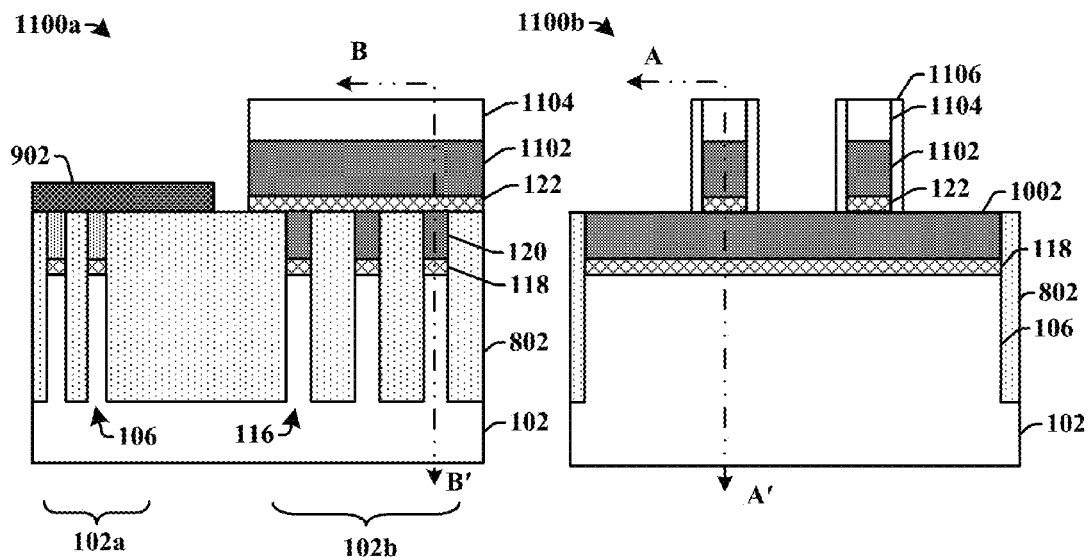
Figure 12:
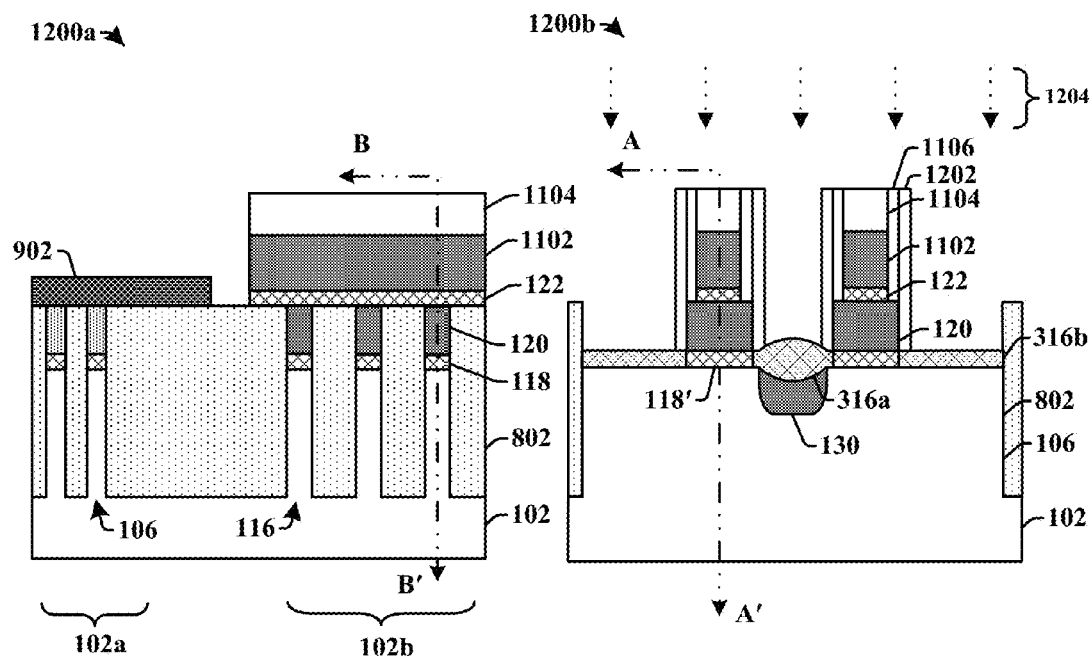

FIG. 11 illustrates some embodiments of cross-sectional views, 1100a and 1100b, of an integrated chip corresponding to act 410.

As shown in cross-sectional views 1100a-100b, a control gate dielectric 122 and a control gate layer 1102 are formed over the floating gate layer 1002. The control gate dielectric 122 laterally extends over multiple ones of the second plurality of fins of semiconductor material 116. In some embodiments, control gate dielectric 122 and the overlying control gate layer 1102 may be formed by a deposition process, and may be subsequently patterned according to an overlying hard mask layer 1104. A first sidewall spacer 1106 may be formed over the floating gate layer 1002 along sidewalls of the control gate dielectric 122 and the control gate layer 1102. In some embodiments, the first sidewall spacer 1106 may comprise an oxide-nitride-oxide sandwich structure.

As shown in cross-sectional views 1200a-1200b, the floating gate layer 1002 may be etched according to the hard mask layer 1104 and the first sidewall spacer 1106 to form floating gates 120. In some embodiments, after forming the floating gates 120 the floating gate oxide 118 may be selectively removed in exposed areas. An implantation process 1204 is subsequently performed to implant a dopant species (e.g., boron, phosphorous, etc.) into the second plurality of fins of semiconductor material 116 to form a common source region 130.

In some embodiments, one or more additional sidewall dielectric layers 1202 may be formed along sides of the floating gates 120 and control gate layer 1102. A common source dielectric 316a may be subsequently formed over the common source region 130 and a drain dielectric layer 316b may be formed over the individual drain regions 132. The common source dielectric 316a may have a greater thickness than the floating gate oxide 118, and may have rounded upper and lower surfaces, in some embodiments. In some embodiments, the one or more additional sidewall dielectric layers 1202 may be formed in a same process as the common source dielectric 316a and/or the drain dielectric layer 316b.

Figure 13:
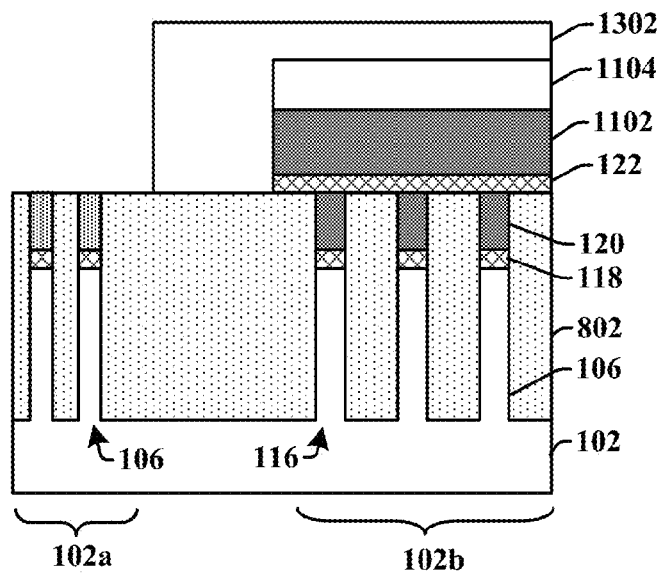

FIG. 13 illustrates some embodiments of a cross-sectional view 1300 of an integrated chip corresponding to act 412.

As shown in cross-sectional view 1300, a second masking layer 1302 is formed over the embedded flash memory region 102b. In various embodiments, the second masking layer 1302 may comprise a photoresist layer or a hard mask layer, for example. In some embodiments, the second masking layer 1302 may comprise a polysilicon mask.

Figure 14:
Figure 14:
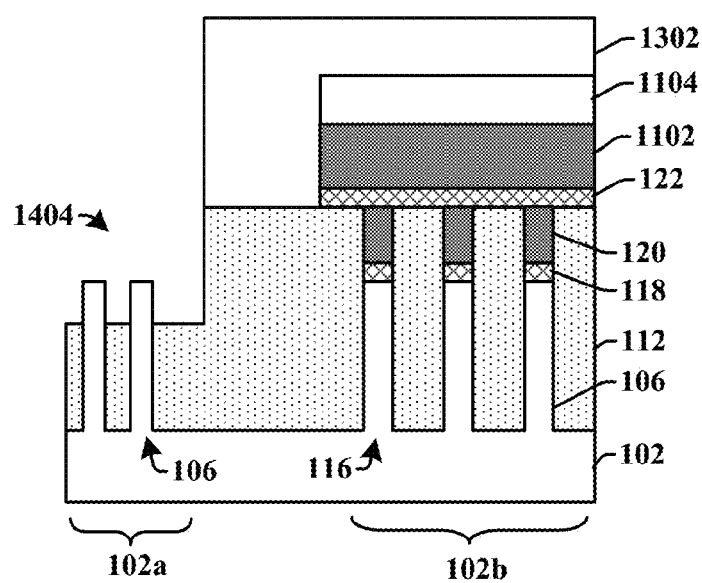

FIG. 14 illustrates some embodiments of a cross-sectional view 1400 of an integrated chip corresponding to act 414.

As shown in cross-sectional view 1400, an unmasked region of the workpiece is exposed to a third etchant 1402. The third etchant 1402 selectively forms a gate electrode recess 1404 within the dielectric material 112 in the logic region 102a. The gate electrode recess 1404 extends to a position that surrounds the first plurality of fins of semiconductor material 106, so that the first plurality of fins of semiconductor material 106 protrude from within the dielectric material 112 to a location within the gate electrode recess 1404.

Figure 15:
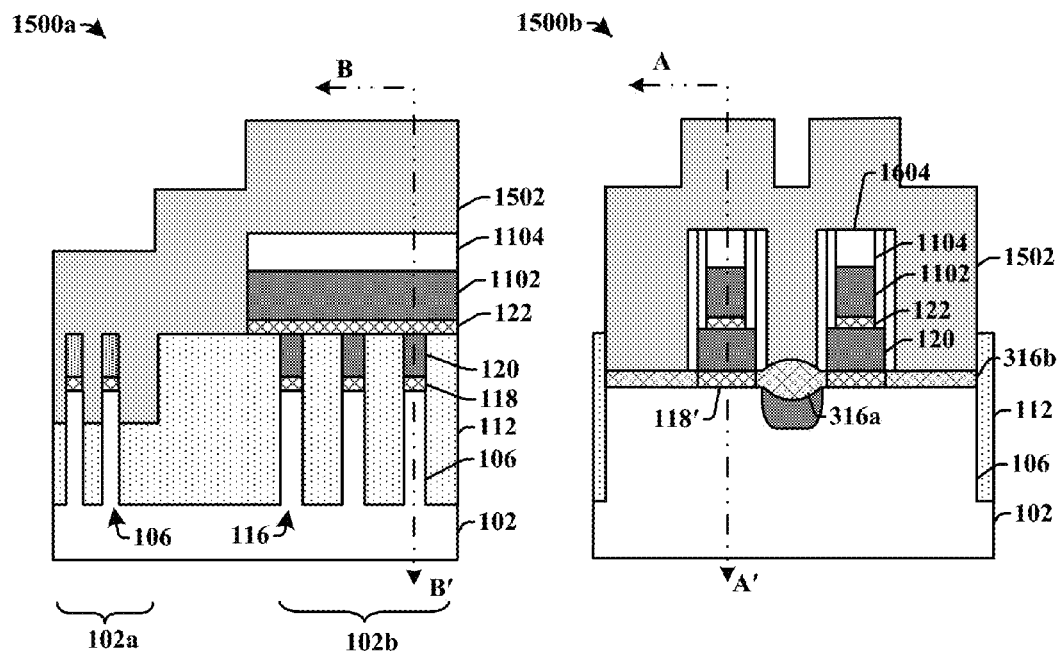
Figure 16:
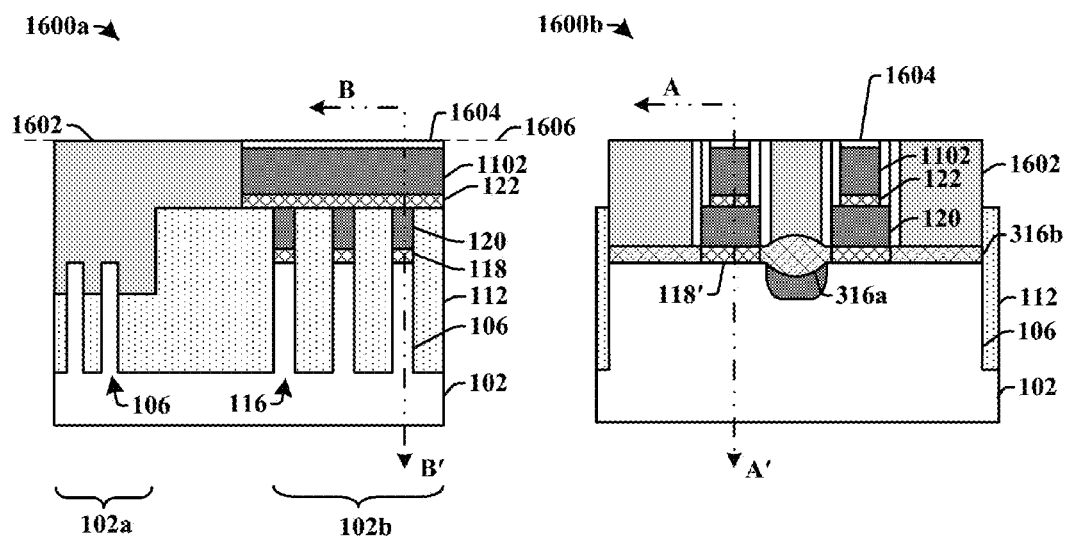

FIGS. 15-16 illustrate some embodiments of cross-sectional views of an integrated chip corresponding to act 416.

As shown in cross-sectional views 1500a-1500b of FIG. 15, a polysilicon layer 1502 is formed over the workpiece. Within the logic region 102a, the polysilicon layer 1502 extends into the gate electrode recess 1404. Within the embedded flash memory region 102b, the polysilicon layer 1502 extends between floating gates 120 of a split gate flash memory cell.

As shown in cross-sectional views 1600a-1600b of FIG. 16, a planarization process is performed. The planarization process removes portions of the polysilicon layer 1602 and the hard mask layer 1604, along a planar surface 1606. In some embodiments, the planarization process may comprise a chemical mechanical polishing (CMP) process. In other embodiments, the planarization process may comprise an etching process.

FIG. 17 illustrates some embodiments of cross-sectional views 1700a-1700c of an integrated chip corresponding to act 418.

As shown in cross-sectional view 1700a-1700c, an unmasked region of the polysilicon layer is exposed to a third etchant 1702 according to masking layer 1704. The third etchant 1402 selectively removes the polysilicon layer to define a sacrificial gate electrode 1706, select gate precursors 1708, and an erase gate precursor 1710.

After the third etchant has patterned the polysilicon layer, a subsequent implantation process may be performed. As shown in cross-sectional view 1700b, the implantation may form individual drain regions, 132a and 132b, within the second plurality of fins of semiconductor material 116 in the embedded flash memory region 102b. In some embodiments, the implantation may also form a source region 126 and a drain region 128 within the logic region 102a for the FinFET devices. In other embodiments, the source region 126 and the drain region 128 may be doped during an epitaxial growth process used to form the source region 126 and the drain region 128.

FIG. 18 illustrates some embodiments of a cross-sectional view 1800 of an integrated chip corresponding to act 420.

As shown in cross-sectional view 1800, a sealant 1802 is formed between the logic region 1102a and the embedded flash memory region 102b. The sealant 1802 is a film configured to maintain a spacing between the logic region 102a and the embedded flash memory region 102b in a subsequent metal replacement gate process (e.g., act 424). In some embodiments, the sealant may comprise silicon carbon nitride (SiCN)

Figure 19:
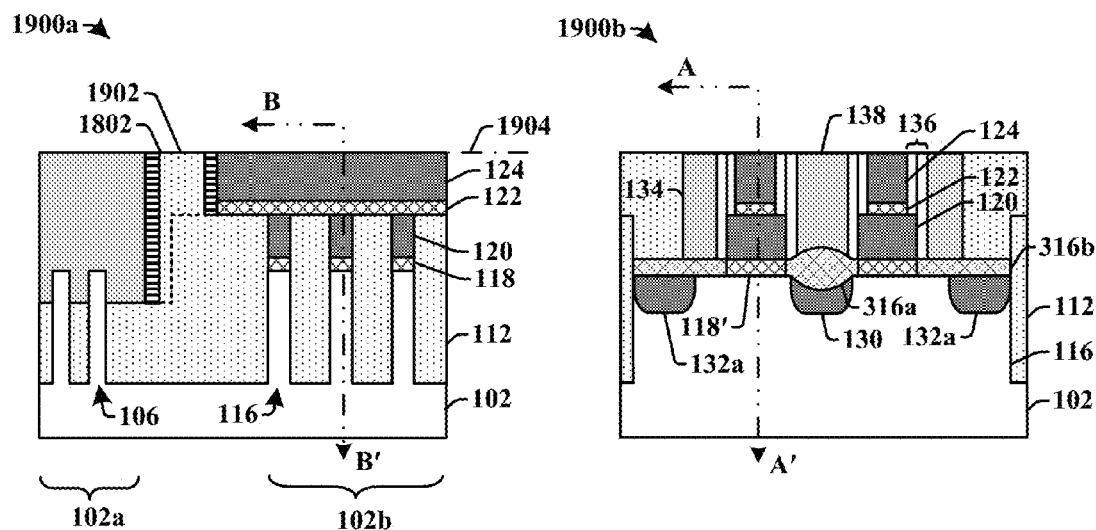
Figure 20:
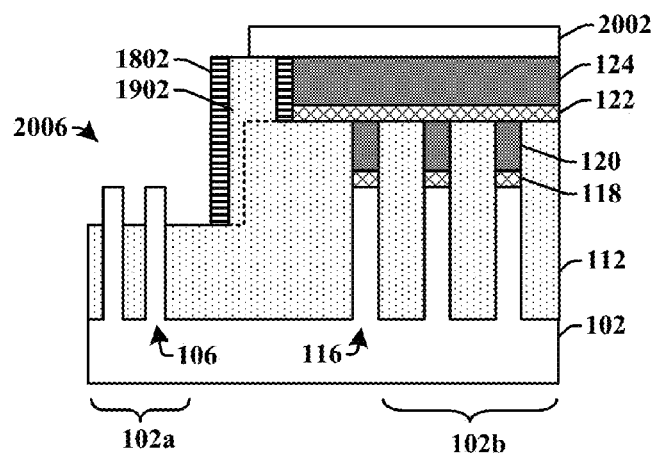
Figure 21:
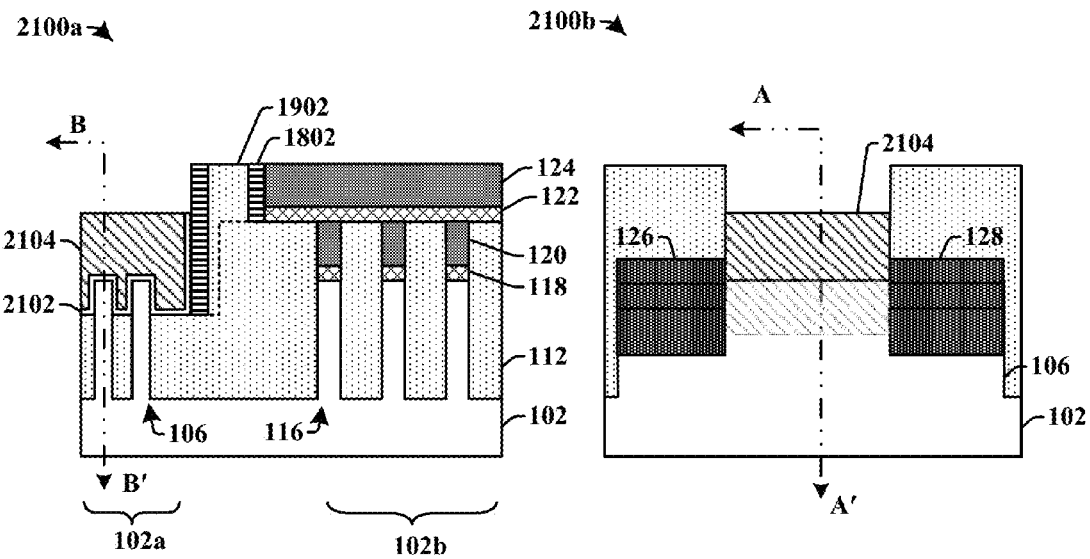

FIGS. 19-21 illustrate some embodiments of cross-sectional views of an integrated chip corresponding to acts 422-424.

As shown in cross-sectional view 1900a of FIG. 19, a dielectric layer 1902 is formed within a recess in the sealant 1802. A planarization process is subsequently performed along line 1904 to remove excess material of the dielectric layer 1902, the sealant 1802, and to remove the hard mask layer (e.g., 1604 of FIG. 18). As shown in cross-sectional view 1900b (along cross-sectional line B-B' of embedded flash memory region 102b), the planarization process removes portions of the select gate precursors 1708 and the erase gate precursor 1710 to form select gates 134 and an erase gate 138.

As shown in cross-sectional view 2000 of FIG. 20, a third masking layer 2002 is formed over the embedded flash memory region 102b. In various embodiments, the third masking layer 2002 may comprise a photoresist layer or a hard mask layer, for example. An etchant 2004 is subsequently applied to the workpiece according to the third masking layer 2002. The etchant 2004 removes the sacrificial gate material resulting in a gate cavity 2006.

As shown in cross-sectional views 2100a-2100b of FIG. 21, a gate dielectric 2102 and a replacement gate material 2104 is deposited within the gate cavity 2006. The replacement gate material 2104 fills the gate cavity 2006. In some embodiments, the replacement gate material 2104 may comprise a high-k and/or metal gate material. For example, the replacement gate material 2104 may comprise a metal gate material comprising one or more metal compounds such as aluminum (Al), molybdenum (Mo), copper (Cu), tungsten (W), titanium (Ti), tantalum (Ta), etc. The replacement gate material 2104 can be deposited by way of a vapor deposition process, such as PVD, CVD, PECVD, etc.

Figure 22:
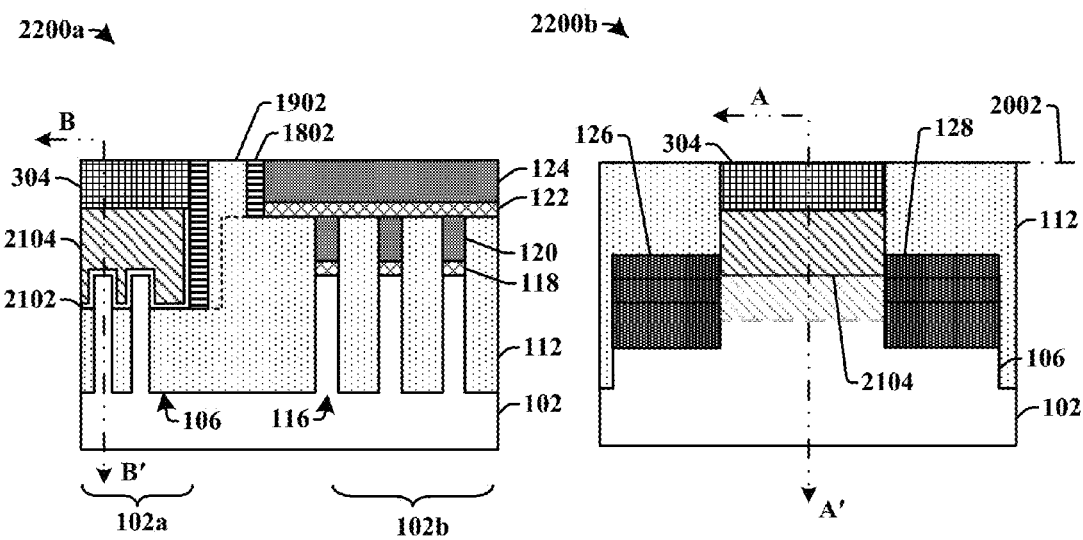

As shown in cross-sectional views 2200a-2200b of FIG. 22, a hard mask layer 304 may be formed over the replacement gate material 2104. The hard mask layer 304 may comprise silicon nitride. The dielectric material 112 may be extended to a location surrounding the hard mask layer 304 and a planarization process may be subsequently performed (along line 2002) to remove excess material from the workpiece and to form a substantially planar surface.

FIG. 23 illustrates some embodiments of cross-sectional views, 2300a and 2300b, of an integrated chip corresponding to acts 426-428.

As shown in cross-sectional views 2300a-2300b, a fourth masking layer 306 is formed over the embedded flash memory region 102b. The fourth masking layer 306 may overlie the hard mask layer 304 and the sealant 1802. A salicidation process is then performed to form a silicide layer 308 on an upper surface of the control gate 124 and on an upper surface of the select gates 134. In some embodiments, the salicidation process may be performed by deposition a nickel layer onto the control gate 124 and the select gates 134, and then performing a thermal annealing process (e.g., a rapid thermal anneal) to form a nickel silicide layer.

FIG. 24 illustrates some embodiments of cross-sectional views 2400a-2400c of an integrated chip corresponding to act 430.

As shown in cross-sectional view 2400a-2400c, one or more inter-level dielectric (ILD) layers 310 are formed over the workpiece. The ILD layers 310 are subsequently etched to form one or more openings that extend through the one or more ILD layers 310. The opening is then filed with a conductive material to form conductive contacts 312.

Therefore, the present disclosure relates to an integrated chip having a FinFET device and an embedded flash memory device, and a method of formation.

In some embodiments, the present disclosure relates to an integrated chip (IC), comprising a logic region comprising a first plurality of fins of semiconductor material protruding outward from a semiconductor substrate. The IC further comprises a gate electrode straddling the first plurality of fins of semiconductor material. The IC further comprises an embedded flash memory region, laterally separated from the logic region along a first direction, and comprising a second plurality of fins of semiconductor material protruding outward from the semiconductor substrate. The IC further comprises a plurality of embedded flash memory cells arranged onto the second plurality of fins of semiconductor material.

In other embodiments, the present disclosure relates to an integrated chip (IC), comprising a first plurality of fins of semiconductor material protruding outwards from a semiconductor substrate, and a gate electrode arranged over and along sidewalls of the first plurality of fins of semiconductor material. The IC further comprises a second plurality of fins of semiconductor material extending outward from the semiconductor substrate, and laterally separated from the first plurality of fins of semiconductor material in a first direction by a dielectric material. The IC further comprises a plurality of floating gates vertically separated from the second plurality of fins of semiconductor material by a gate dielectric layer, a control gate vertically separated from the plurality of floating gates by a control gate dielectric, a select gate separated from a first side of the control gate, along a second direction perpendicular to the first direction, by a sidewall dielectric layer, and an erase gate separated from a second side of the control gate along the second direction by the sidewall dielectric layer.

In yet other embodiments, the present disclosure relates to a method of forming an integrated chip. The method comprises patterning a semiconductor substrate to concurrently form a first plurality of fins of semiconductor material that protrude from the semiconductor substrate and a second plurality of fins of semiconductor material that protrude from the semiconductor substrate, wherein the first plurality of fins of semiconductor material are laterally separated from the second plurality of fins of semiconductor material. The method further comprises forming a gate electrode over and along sidewalls of the first plurality of fins of semiconductor material. The method further comprises forming an embedded flash memory cell onto the second plurality of fins of semiconductor material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip, comprising:
   a logic region comprising a first plurality of fins of semiconductor material protruding outward from a semiconductor substrate and respectively comprising a first long edge and a first short edge;
   a gate electrode straddling the first plurality of fins of semiconductor material;
   an embedded flash memory region, laterally separated from the logic region along a first direction, and comprising a second plurality of fins of semiconductor material protruding outward from the semiconductor substrate and respectively comprising a second long edge and a second short edge, wherein the second short edge has a greater width than the first short edge; and
   a plurality of embedded flash memory cells arranged onto the second plurality of fins of semiconductor material.

2. The integrated chip of claim 1, further comprising:
   a dielectric material arranged over the semiconductor substrate at a position laterally between the first plurality of fins of semiconductor material and the second plurality of fins of semiconductor material.

3. The integrated chip of claim 2, wherein the plurality of embedded flash memory cells respectively comprise:
   a floating gate disposed over one of the second plurality of fins of semiconductor material and laterally separated from an adjacent floating gate by the second plurality of fins in a first direction and by the dielectric material in a second direction;
   a control gate vertically separated from the floating gate by a control gate dielectric;
   a select gate arranged along a first side of the control gate and separated from the control gate and the floating gate by a sidewall dielectric layer; and
   an erase gate arranged along a second side of the control gate and separated from the control gate and the floating gate by the sidewall dielectric layer.

4. The integrated chip of claim 3, further comprising:
   a gate dielectric layer vertically arranged between the floating gate and the one of the second plurality of fins of semiconductor material.

5. The integrated chip of claim 3, wherein the floating gate has outermost sidewalls that are substantially aligned with outermost sidewalls of the one of the second plurality of fins of semiconductor material.

6. The integrated chip of claim 3, wherein the floating gate is vertically overlying and laterally offset from upper surfaces of the first plurality of fins of semiconductor material.

7. The integrated chip of claim 3, wherein the control gate extends in the first direction over more than one of the second plurality of fins of semiconductor material.

8. The integrated chip of claim 3, further comprising:
   a hard mask layer arranged over the gate electrode and having an upper surface that is substantially aligned with an upper surface of the select gate.

9. The integrated chip of claim 3, wherein an upper surface of the gate electrode underlies an upper surface of the control gate.

10. The integrated chip of claim 1, wherein upper surfaces of the first plurality of fins of semiconductor material are vertically aligned with upper surfaces of the second plurality of fins of semiconductor material.

11. The integrated chip of claim 1, wherein the first plurality of fins of semiconductor material are arranged in the first direction at a first pitch and the second plurality of fins of semiconductor material are arranged in the first direction at a second pitch that is larger than the first pitch.

12. An integrated chip, comprising
   a first plurality of fins of semiconductor material protruding outward from a semiconductor substrate and laterally separated by a dielectric material overlying the semiconductor substrate;
   a gate electrode arranged over and along sidewalls of the first plurality of fins of semiconductor material;
   a second plurality of fins of semiconductor material extending outward from the semiconductor substrate, and laterally separated from the first plurality of fins of semiconductor material in a first direction by the dielectric material;
   a plurality of floating gates vertically separated from the second plurality of fins of semiconductor material by a gate dielectric layer and laterally separated from one another by the dielectric material;
   a control gate vertically separated from the plurality of floating gates and the dielectric material by a control gate dielectric;
   a select gate separated from a first side of the control gate, along a second direction perpendicular to the first direction, by a sidewall dielectric layer; and
   an erase gate separated from a second side of the control gate along the second direction by the sidewall dielectric layer.

13. The integrated chip of claim 12, wherein the plurality of floating gates have sidewalls that are substantially aligned with sidewalls of the second plurality of fins of semiconductor material.

14. The integrated chip of claim 12, wherein the control gate extends in the first direction over more than one of the second plurality of fins of semiconductor material.

15. The integrated chip of claim 12, wherein the first plurality of fins of semiconductor material have a first width in the first direction and the second plurality of fins of semiconductor material have a second width in the first direction that is larger than the first width.

16. The integrated chip of claim 12, wherein upper surfaces of the first plurality of fins of semiconductor material are substantially aligned with upper surfaces of the second plurality of fins of semiconductor material.

17. A method of forming an integrated chip, comprising:
   patterning a semiconductor substrate to concurrently form a first plurality of fins of semiconductor material that protrude from the semiconductor substrate and a second plurality of fins of semiconductor material that protrude from the semiconductor substrate, wherein the first plurality of fins of semiconductor material are laterally separated from the second plurality of fins of semiconductor material;
   forming a dielectric material laterally separating the first plurality of fins and the second plurality of fins;
   forming a gate dielectric layer and a floating gate layer over the second plurality of fins within recesses in the dielectric material;
   forming a control gate dielectric over the dielectric material and the floating gate layer;
   forming a control gate over the control gate dielectric;
   selectively etching the dielectric material to form a cavity extending over and along sidewalls of the first plurality of fins; and
   depositing a conductive material that forms a gate electrode within the cavity and an erase gate and a select gate over the second plurality of fins.

18. The integrated chip of claim 1, wherein the gate electrode extends over the first plurality of fins in a first direction that is perpendicular to a second direction of a long axis of the second plurality of fins of semiconductor material.

19. The integrated chip of claim 2, wherein the plurality of embedded flash memory cells respectively comprise a control gate dielectric layer having a lower surface contacting the dielectric material.

20. The integrated chip of claim 3, wherein the control gate has a bottom surface that is vertically above top surfaces of the second plurality of fins of semiconductor material.

* * * * *